United States Patent
Mentovich et al.

(10) Patent No.: US 12,289,839 B2
(45) Date of Patent: Apr. 29, 2025

(54) PROCESS FOR LOCALIZED REPAIR OF GRAPHENE-COATED LAMINATION STACKS AND PRINTED CIRCUIT BOARDS

(71) Applicants: Mellanox Technologies, Ltd., Yokneam (IL); Bar-Ilan University, Ramat Gan (IL)

(72) Inventors: Elad Mentovich, Tel Aviv (IL); Boaz Atias, Maale Adumim (IL); Doron Naveh, Petah-Tikva (IL); Eilam Zigi Ben Smolinsky, Ramat Gan (IL); Adi Levi, Rosh HaAyin (IL)

(73) Assignees: Mellanox Technologies, Ltd., Yokneam (IL); Bar-Ilan University, Ramat Gan (IL)

( * ) Notice: Subject to any disclaimer, the term of this patent is extended or adjusted under 35 U.S.C. 154(b) by 567 days.

(21) Appl. No.: 17/305,233

(22) Filed: Jul. 1, 2021

(65) Prior Publication Data
US 2022/0377907 A1    Nov. 24, 2022

Related U.S. Application Data

(60) Provisional application No. 63/201,910, filed on May 18, 2021.

(51) Int. Cl.
*H05K 3/22* (2006.01)
*C01B 32/188* (2017.01)
*H05K 1/02* (2006.01)

(52) U.S. Cl.
CPC ........... *H05K 3/225* (2013.01); *C01B 32/188* (2017.08); *H05K 1/0298* (2013.01); *H05K 2203/107* (2013.01); *H05K 2203/1105* (2013.01)

(58) Field of Classification Search
CPC ................ C01B 32/188; C23C 16/481; H05K 2201/0323
See application file for complete search history.

(56) References Cited

U.S. PATENT DOCUMENTS

| | | | |
|---|---|---|---|
| 3,672,948 A | 6/1972 | Foehring | |
| 4,417,722 A | 11/1983 | Ishii | |

(Continued)

FOREIGN PATENT DOCUMENTS

| | | |
|---|---|---|
| CN | 105779961 A | 7/2016 |
| DE | 112013006022 T5 | 9/2015 |

(Continued)

OTHER PUBLICATIONS

Steinberg et al., pending U.S. Appl. No. 18/200,314, filed May 22, 2023.

(Continued)

*Primary Examiner* — Edward Chin
(74) *Attorney, Agent, or Firm* — Michele M. Glessner; Moore & Van Allen PLLC

(57) ABSTRACT

Processes for localized lasering of a lamination stack and graphene-coated printed circuit board (PCB) are disclosed. An example PCB may include a lamination stack, post-lamination, that may further include a core, an adhesive layer, and at least one graphene-metal structure. A top layer of graphene of the graphene-metal structure may have never been grown before the lamination process or may have been removed post-lamination such that a portion of the top layer of graphene is missing. The localized lasering process described herein may grow (for the first time) or re-grow the graphene layer of the exposed portion of the metal layer without adverse effects to the rest of the lamination stack or PCB and while promoting a uniform layer of graphene on the top surface. A process of growing graphene through (Continued)

application of molecular layer and a self-assembled monolayer (SAM), are also described herein.

17 Claims, 9 Drawing Sheets

(56) References Cited

U.S. PATENT DOCUMENTS

| | | | |
|---|---|---|---|
| 4,450,034 A | 5/1984 | Stern | |
| 4,455,181 A | 6/1984 | Lifshin et al. | |
| 4,931,425 A | 6/1990 | Kimura | |
| 5,108,532 A | 4/1992 | Thein et al. | |
| 5,256,474 A | 10/1993 | Johnston | |
| 6,117,266 A | 9/2000 | Horzel et al. | |
| 6,432,239 B1 | 8/2002 | Mandai et al. | |
| 7,798,096 B2 | 9/2010 | Mahajani et al. | |
| 9,215,797 B2 | 12/2015 | Mori et al. | |
| 9,384,875 B2 | 7/2016 | Kimura et al. | |
| 9,431,487 B2 | 8/2016 | Bol et al. | |
| 9,924,619 B2 | 3/2018 | Kim et al. | |
| 10,022,947 B2 | 7/2018 | Kimura et al. | |
| 10,518,506 B2 | 12/2019 | Miyazono et al. | |
| 10,717,260 B2 | 7/2020 | Shimizu et al. | |
| 11,105,567 B2 | 8/2021 | Fan et al. | |
| 2005/0112344 A1 | 5/2005 | Redfern et al. | |
| 2006/0042059 A1 | 3/2006 | Satoh | |
| 2008/0173238 A1 | 7/2008 | Nakashima et al. | |
| 2010/0047447 A1 | 2/2010 | Cook | |
| 2010/0068383 A1 | 3/2010 | Kato et al. | |
| 2010/0068893 A1 | 3/2010 | Kato et al. | |
| 2010/0196124 A1 | 8/2010 | Fukuma et al. | |
| 2011/0076118 A1 | 3/2011 | Kurita et al. | |
| 2011/0091646 A1 | 4/2011 | Aliatieh | |
| 2011/0123776 A1 | 5/2011 | Shin et al. | |
| 2013/0108839 A1* | 5/2013 | Arnold | B82Y 30/00 977/734 |
| 2013/0189635 A1 | 7/2013 | Lim | |
| 2013/0248229 A1 | 9/2013 | Martens et al. | |
| 2013/0299077 A1 | 11/2013 | Hong | |
| 2013/0344246 A1 | 12/2013 | Li | |
| 2014/0053973 A1 | 2/2014 | Shin et al. | |
| 2015/0064470 A1 | 3/2015 | Kimura et al. | |
| 2015/0123080 A1 | 5/2015 | Yamaguchi | |
| 2015/0360370 A1 | 12/2015 | Mazzocco et al. | |
| 2016/0027935 A1 | 1/2016 | Naito et al. | |
| 2016/0049475 A1 | 2/2016 | Bol et al. | |
| 2016/0076829 A1 | 3/2016 | Lee et al. | |
| 2016/0079001 A1 | 3/2016 | Lin et al. | |
| 2016/0093478 A1 | 3/2016 | Guo | |
| 2017/0029279 A1 | 2/2017 | Kim | |
| 2017/0125136 A1 | 5/2017 | Park et al. | |
| 2017/0130336 A1 | 5/2017 | Fujikura | |
| 2017/0207484 A1 | 7/2017 | Zhamu et al. | |
| 2017/0211706 A1 | 7/2017 | Amir | |
| 2017/0273181 A1 | 9/2017 | Sohn et al. | |
| 2017/0290167 A1 | 10/2017 | Pun et al. | |
| 2017/0338312 A1 | 11/2017 | Treossi et al. | |
| 2019/0047262 A1 | 2/2019 | Minakuchi et al. | |
| 2019/0143369 A1 | 5/2019 | Lin et al. | |
| 2019/0143656 A1 | 5/2019 | Lin et al. | |
| 2019/0145007 A1 | 5/2019 | Lin et al. | |
| 2019/0283377 A1 | 9/2019 | Lin et al. | |
| 2019/0283378 A1 | 9/2019 | Lin et al. | |
| 2019/0283379 A1 | 9/2019 | Lin et al. | |
| 2019/0284712 A1 | 9/2019 | Lin et al. | |
| 2019/0292675 A1 | 9/2019 | Lin et al. | |
| 2019/0292676 A1 | 9/2019 | Lin et al. | |
| 2019/0292720 A1 | 9/2019 | Lin et al. | |
| 2019/0292721 A1 | 9/2019 | Lin et al. | |
| 2019/0292722 A1 | 9/2019 | Lin et al. | |
| 2019/0332015 A1* | 10/2019 | Poiesz | G03F 7/707 |
| 2021/0091368 A1 | 3/2021 | House et al. | |
| 2021/0091383 A1 | 3/2021 | House et al. | |
| 2021/0100090 A1 | 4/2021 | Chang | |
| 2021/0139700 A1 | 5/2021 | Arimoto et al. | |
| 2021/0184181 A1 | 6/2021 | Ding | |
| 2021/0260859 A1 | 8/2021 | Le Rhun et al. | |
| 2022/0131040 A1 | 4/2022 | Chen et al. | |
| 2022/0161537 A1 | 5/2022 | Quellmalz et al. | |
| 2022/0169002 A1 | 6/2022 | Honda et al. | |
| 2022/0204348 A1* | 6/2022 | Gao | H01L 31/035209 |
| 2022/0372621 A1 | 11/2022 | Mentovich | |
| 2022/0372622 A1 | 11/2022 | Mentovich | |
| 2022/0377912 A1 | 11/2022 | Atias | |
| 2023/0002906 A1 | 1/2023 | Mentovich | |
| 2023/0007788 A1 | 1/2023 | Atias | |
| 2023/0007789 A1 | 1/2023 | Mentovich | |

FOREIGN PATENT DOCUMENTS

| | | | |
|---|---|---|---|
| EP | 3723122 A1 | | 10/2020 |
| KR | 20190058231 A | * | 5/2019 |
| WO | 2015062760 A1 | | 5/2015 |
| WO | 2020152358 A1 | | 7/2020 |

OTHER PUBLICATIONS

Steinberg et al., pending U.S. Appl. No. 18/200,352, filed May 22, 2023.

Chinese Office Action from corresponding Chinese Application No. 202210515308.4 dated Oct. 28, 2023, 4 pages, with English Translation.

Zuo Dunwen, "Modern Processing Technology," Beijing University of Aeronautics and Astronautics Press, pp. 299-301, Mar. 31, 2005.

Xu Binshi, "Material Surface Engineering," Harbin Institute of Technology Press, p. 300, Dec. 31, 2014.

* cited by examiner

PROCESS FOR LOCALIZED REPAIR OF GRAPHENE-COATED LAMINATION STACKS AND PRINTED CIRCUIT BOARDS

CROSS-REFERENCE TO RELATED APPLICATIONS

This application claims priority to U.S. Provisional Patent Application No. 63/201,910, filed May 18, 2021, the contents of which are incorporated herein by reference in their entirety.

TECHNOLOGICAL FIELD

Embodiments of the present invention relate generally to processes for localized repair of graphene-coated lamination stacks and printed circuit boards (PCBs). In particular, embodiments of the present invention apply localized heat under vacuum or controlled gas atmosphere to repair defect locations on the lamination stacks or PCBs.

BACKGROUND

A PCB is used to electrically connect electronic components using conductive pathways, often called traces, etched from metal sheets. The metal sheets are often laminated onto non-conductive materials, which may be referred to as the "core" of the PCB. For instance, a metal sheet may be comprised of copper or nickel. As the demand for higher bandwidth increases, so too does the demand for higher frequency performance and heat management of PCBs. Through handling or use, an outer layer of a lamination stack that forms the PCB or the resulting PCB itself may get damaged in some areas, which may have a negative effect on the performance of the PCB and may require replacement of the entire lamination stack or PCB under conventional methods.

BRIEF SUMMARY

As such, an improved process for promoting the localized growth of graphene on the surface of a lamination stack or PCB is described herein. The repair may be accomplished through the localized application of heat, including under vacuum or controlled gas atmosphere, including the application of heat via a laser, and in some cases may include the steps of heating and cooling at specific temperatures and at specific intervals under vacuum or controlled gas atmosphere.

In some embodiments, the process for localized repair of graphene-coated lamination stacks and printed circuit boards may include an apparatus to apply each of the materials discussed in further detail below and carry out the processes herein described. An example apparatus may include a continuous-feed CVD system described in the application titled, CONTINUOUS-FEED CHEMICAL VAPOR DEPOSITION SYSTEM, Ser. No. 17/305,203, filed concurrently with the present application and the contents of which are hereby incorporated by reference in their entirety. Further, in some embodiments, the continuous-feed CVD system may include a substrate carrier and associated mechanisms for moving the lamination stack and printed circuit board through the continuous-feed CVD system, such as the substrate carrier and associated mechanisms described in the application titled, CVD SYSTEM WITH SUBSTRATE CARRIER AND ASSOCIATED MECHANISMS FOR MOVING SUBSTRATE THERETHROUGH, Ser. No. 17/305,206, filed concurrently with the present application and the contents of which are hereby incorporated by reference in their entirety. Further, in some embodiments, the continuous-feed CVD system may include components configured for facilitating uniform and laminar flow, such as the components described in the application titled, CVD SYSTEM WITH FLANGE ASSEMBLY FOR FACILITATING UNIFORM AND LAMINAR FLOW, Ser. No. 17/305,209, filed concurrently with the present application and the contents of which are hereby incorporated by reference in their entirety.

In some embodiments, the process for localized repair of graphene-coated lamination stacks and printed circuit boards may include the process for creating the graphene-coated lamination stack and printed circuit board, such as the method and product described in the application titled, PROCESS FOR LAMINATING GRAPHENE-COATED PRINTED CIRCUIT BOARDS, Ser. No. 17/305,205, filed concurrently with the present application and the contents of which are hereby incorporated by reference in their entirety. Further, in some embodiments, the process for localized repair of graphene-coated lamination stacks and printed circuit boards include the materials and processes including the material of hexagonal Boron Nitride (h-BN) as an alternative coating to the lamination stack and printed circuit board and methods for doping and removing structures within the lamination stacks and printed circuit boards, such as the materials and processes described in the application titled, PROCESS FOR LAMINATING CONDUCTIVE-LUBRICANT COATED METALS FOR PRINTED CIRCUIT BOARDS, Ser. No. 17/305,223, filed concurrently with the present application and the contents of which are hereby incorporated by reference in their entirety. Further, in some embodiments, the process for localized repair of graphene-coated lamination stacks and printed circuit boards include the materials and processes to create a two-dimensional-target structure (including graphene coating of such two-dimensional-target structures), such as the methods and products described in the application titled, PROCESS FOR APPLYING A TWO-DIMENSIONAL MATERIAL TO A TARGET SUBSTRATE POST-LAMINATION, Ser. No. 17/305,238, filed concurrently with the present application and the contents of which are hereby incorporated by reference in their entirety.

In particular, embodiments of the present invention provide an improved process for localized repair of a PCB containing a graphene-metal structure, where a portion of the graphene of the graphene-metal structure is missing due to wear or defect, or was never grown. The improvements provided by embodiments of the present invention further include an expedited process of either regrowing a graphene layer on an exposed metal layer of a PCB or growing (for the first time) a graphene layer on an exposed metal layer of a PCB.

The details of some embodiments of the subject matter described in this specification are set forth in the accompanying drawings and the description below. Other features, aspects, and advantages of the subject matter will become apparent from the description, the drawings, and the claims.

In accordance with some embodiments of the present invention, a method of repairing one or more layers of a lamination stack or Printed Circuit Board (PCB) is provided, wherein the method comprises: providing a layered structure, wherein an outer layer comprises a graphene-metal structure, and wherein the graphene-metal structure comprises a metal layer and an outer graphene layer disposed on the metal layer; identifying a defect location in the outer graphene layer; preparing a surface of the outer graphene layer, wherein the surface of the outer graphene layer comprises at least the defect location; applying a localized heat to the defect location, and wherein application of the localized heat encourages growth of graphene in the defect location.

In accordance with another aspect of the present invention, the method of repairing one or more layers of a lamination stack or PCB may include the embodiment wherein preparing the surface of the outer graphene layer comprises cleaning a surface of the metal layer in the defect location prior to the application of localized heat.

In accordance with another aspect of the present invention, the method of repairing one or more layers of a lamination stack or PCB may include the embodiment wherein preparing the surface of the outer graphene layer comprises applying a carbon-based compound layer to the metal layer in the defect location.

In accordance with another aspect of the present invention, the method of repairing one or more layers of a lamination stack or PCB may further comprise baking the layers.

In accordance with another aspect of the present invention, the method of repairing one or more layers of a lamination stack or PCB may further comprise washing the lamination stack to clean an excess of the carbon-based compound.

In accordance with another aspect of the present invention, the method of repairing one or more layers of a lamination stack or PCB may further include the embodiment wherein preparing the surface of the outer graphene layer comprises applying precursor molecules to the metal layer in at least the defect location. In accordance with another aspect of the present invention, the method of repairing one or more layers of a lamination stack or PCB may further comprise washing the layers to clean the molecular layer. In accordance with another aspect of the present invention, the method of repairing one or more layers of a lamination stack or PCB may further comprise baking the layers.

In accordance with another aspect of the present invention, the method of repairing one or more layers of a lamination stack or PCB may include the embodiment wherein the layered structure forms at least a portion of a Printed Circuit Board (PCB) and wherein the metal layer comprises a trace of the PCB.

In accordance with another aspect of the present invention, the method of repairing one or more layers of a lamination stack or PCB may include the embodiment wherein the layered structure forms at least a portion of a lamination stack.

In accordance with another aspect of the present invention, the method of repairing one or more layers of a lamination stack or PCB may include the embodiment wherein applying the localized heat comprises applying the localized heat via a laser. In accordance with another aspect of the present invention, the method of repairing one or more layers of a lamination stack or PCB may further comprise determining a local temperature for configuring the laser, wherein the local temperature is determined by a laser power density and a laser scan rate.

In accordance with another aspect of the present invention, the method of repairing one or more layers of a lamination stack or PCB may include the embodiment wherein applying the localized heat comprises pulsing the localized heat.

In accordance with another aspect of the present invention, the method of repairing one or more layers of a lamination stack or PCB may include the embodiment wherein applying the localized heat comprises continuously applying the localized heat.

In accordance with another aspect of the present invention, the method of repairing one or more layers of a lamination stack or PCB may further comprise cooling the lamination stack at the defect location by pulsing the localized heat.

BRIEF DESCRIPTION OF THE DRAWINGS

Figure 1:
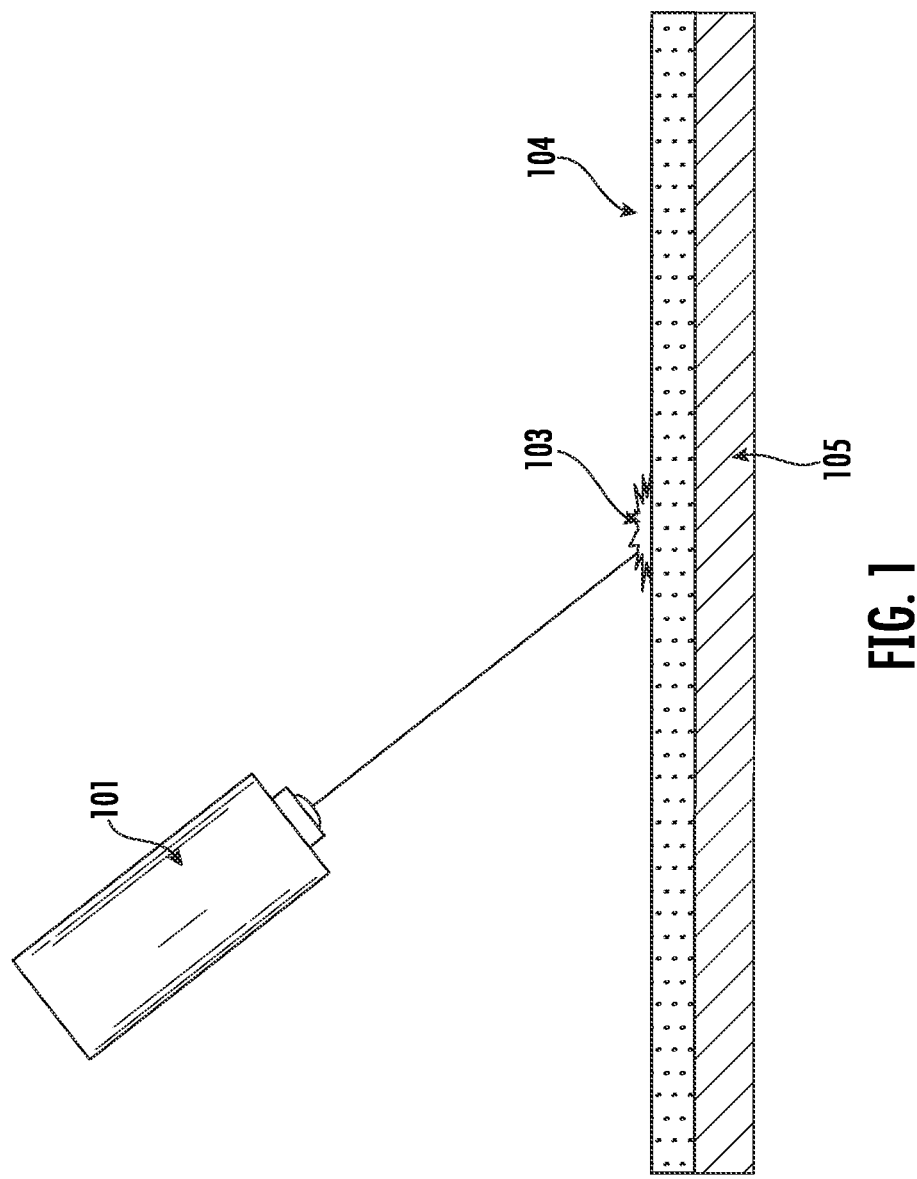
Figure 2A:
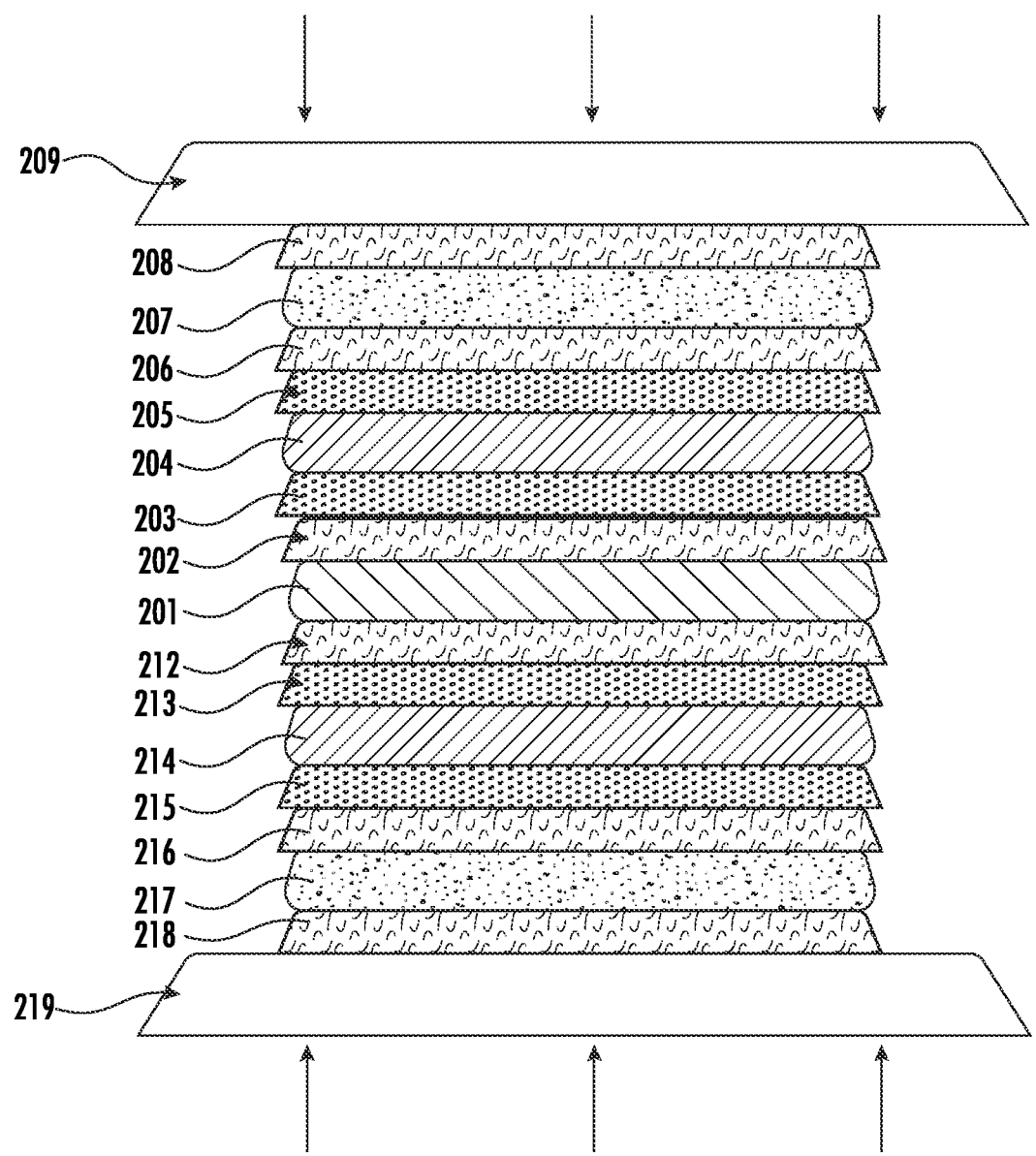
Figure 2B:
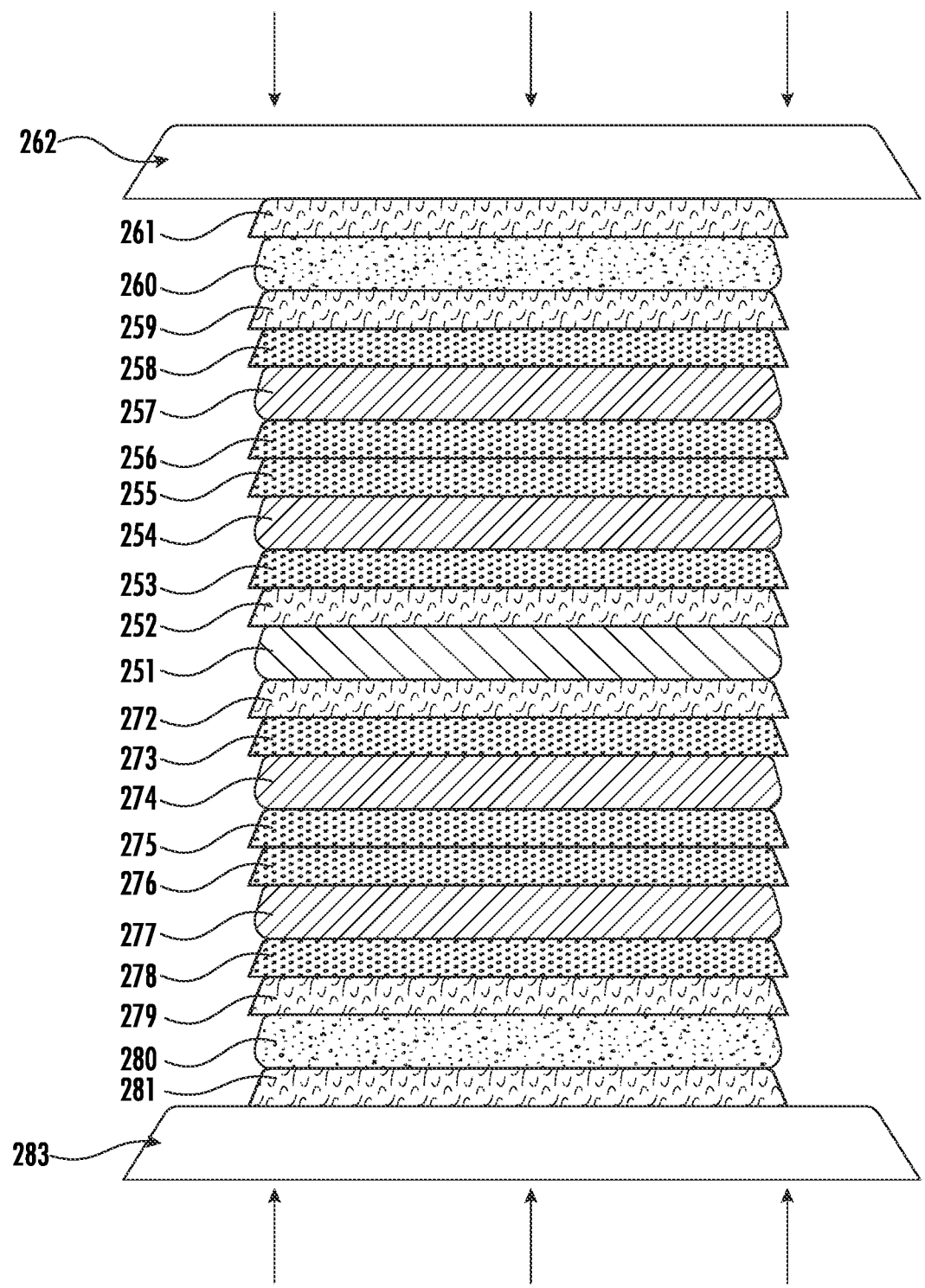
Figure 3:
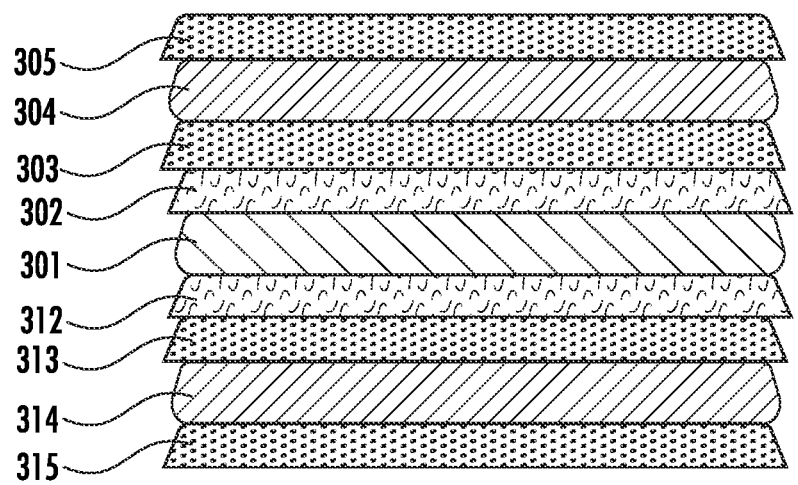
Figure 4:
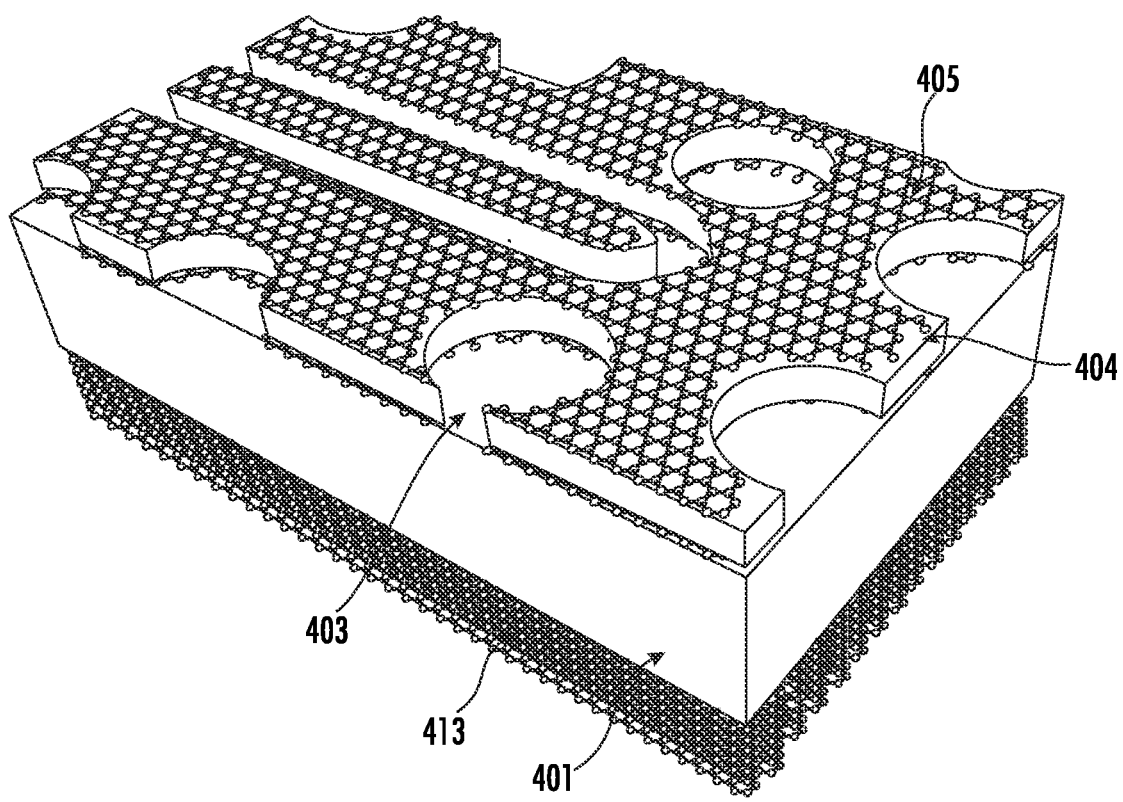
Figure 5:
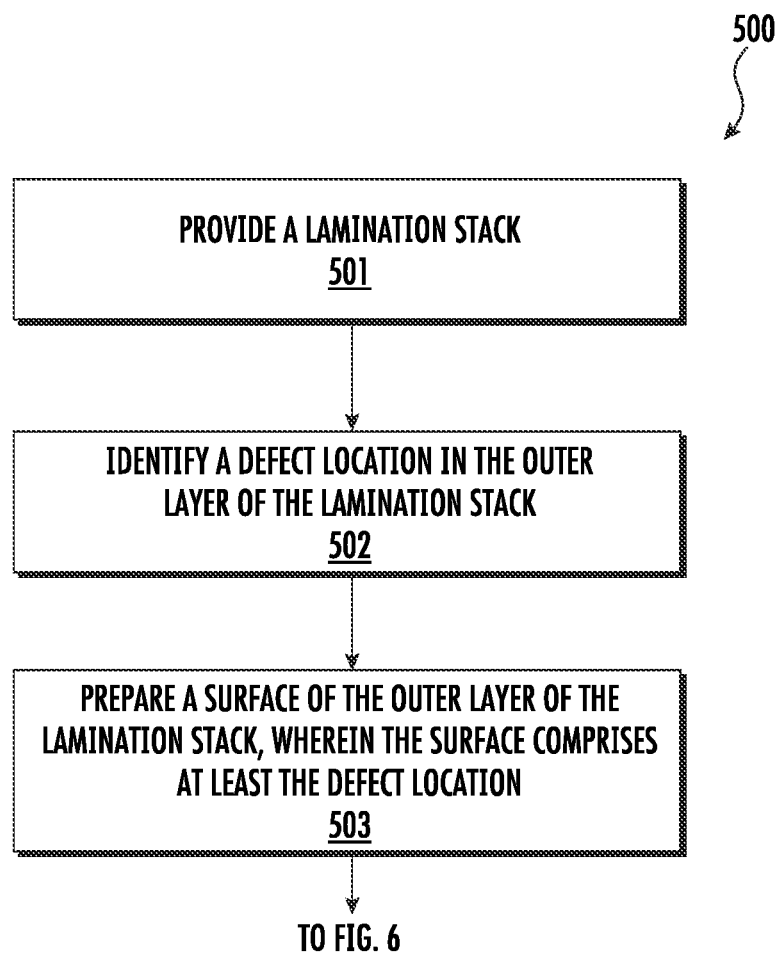
Figure 6:
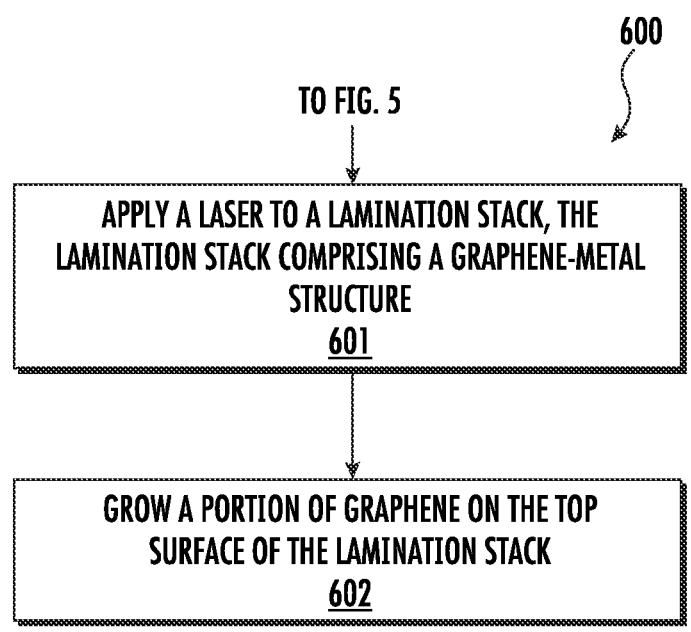
Figure 7:
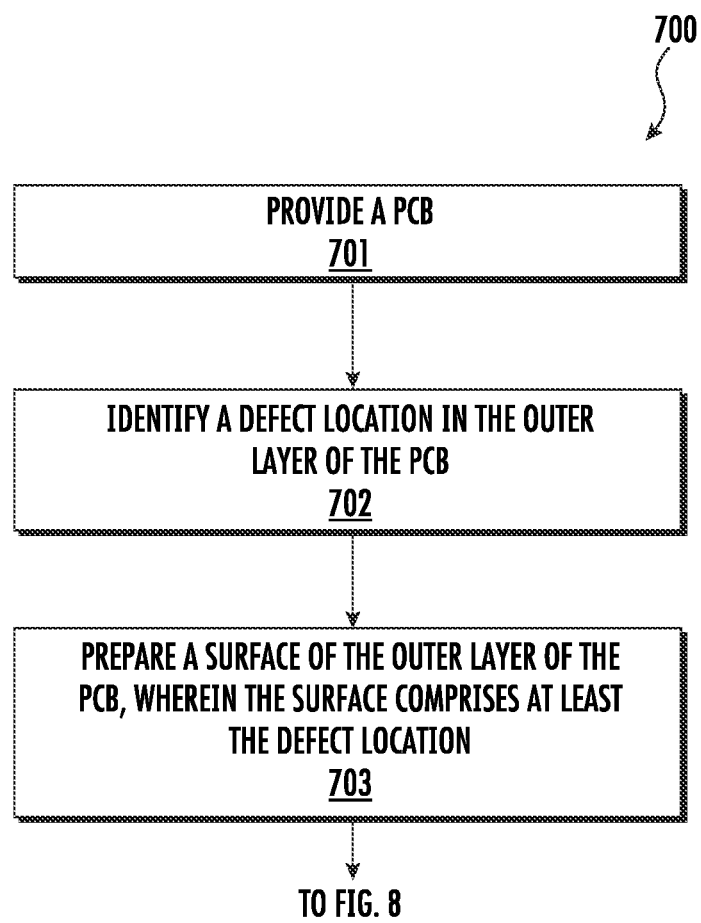
Figure 8:
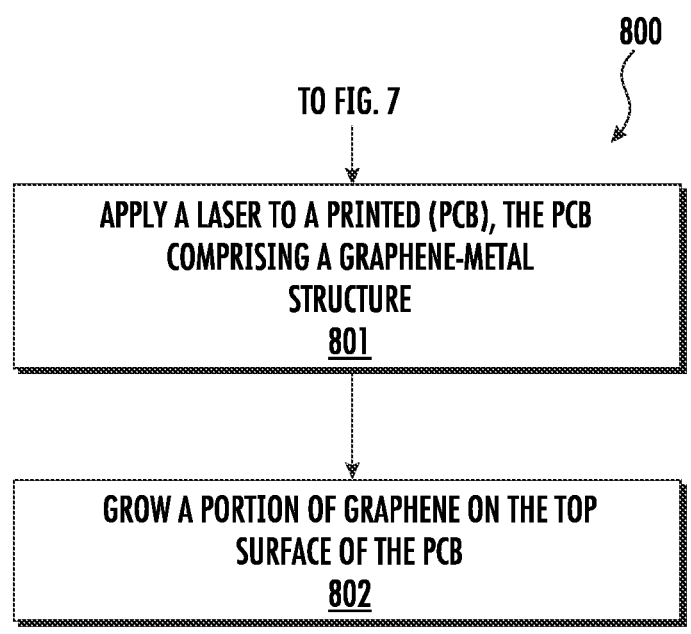

Having thus described the disclosure in general terms, reference will now be made to the accompanying drawings, which are not necessarily drawn to scale, and wherein:

FIG. 1 is a schematic depiction of a heat source applying localized heat for growing a portion of a graphene layer on a lamination stack or a PCB, in accordance with one or more embodiments of the present invention;

FIG. 2A illustrates an exploded side view of a lamination stack associated with a PCB comprising at least a graphene-metal structure, in accordance with one or more embodiments of the present invention;

FIG. 2B illustrates an exploded side view of a lamination stack associated with a PCB comprising multiple graphene-metal structures, in accordance with one or more embodiments of the present invention;

FIG. 3 illustrates an exploded side view of a lamination stack, in accordance with one or more embodiments of the present invention;

FIG. 4 illustrates an example PCB, post-lamination process, rotated at a 45-degree angle, in accordance with one or more embodiments of the present invention;

FIG. 5 illustrates an example flowchart of a method for identifying a defect location in the outer layer of a lamination stack and for promoting the localized growth of graphene on a lamination stack, in accordance with one or more embodiments of the present invention;

FIG. 6 illustrates an example flowchart of a method for promoting the localized growth of graphene on a lamination stack, further including applying a laser to the lamination stack, in accordance with one or more embodiments of the present invention;

FIG. 7, illustrates an example flowchart of a method for identifying a defect location in the outer layer of a PCB and a method for promoting the localized growth of graphene on a PCB, in accordance with one or more embodiments of the present invention; and FIG. 8, illustrates an example flowchart of a method for promoting the localized growth of graphene on a PCB, further including applying a laser to the PCB, in accordance with one or more embodiments of the present invention.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. As used herein, terms such as "front," "rear," "top," "inside," "outside," "inner," "outer," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

A lamination stack, generally, may be understood to be the stack of materials used to create a PCB. For example, such materials may include a non-conductive material (e.g., the core), an adhesive layer, and a conductive metal such as copper. The lamination stack may then be laminated (i.e., heated and/or pressurized) to solidify a bond between the materials to create the structure of the PCB. The metal layer (e.g., copper) may be etched to create the conductive trace of the PCB.

In the present invention, a lamination stack comprising a graphene-metal structure, rather than just a metal layer (e.g., copper), is described that is configured to allow a resulting PCB that is formed from the lamination stack to have improved high frequency performance and improved heat management. The graphene-metal structure is arranged on or around the core of the lamination stack. An adhesive layer may be used to attach the graphene-metal structure to the core of the lamination stack at the pre-processing stage of the PCB. By adding a graphene-metal structure to a lamination stack, where traditionally only a metal structure is placed on the lamination stack, the resulting PCB in imbued with improved properties over a conventional PCB. For instance, the inclusion of graphene improves heat management because of its high heat conductivity properties, promotes higher electrical conductivity, and allows higher electron mobility, without having to make allowances for increased thickness on a PCB (graphene is extremely thin as a monolayer and as multiple graphene layers).

The graphene layer of the PCB or the lamination stack may comprise a defect location, such as where a portion of the graphene layer may be damaged or missing. A portion of the graphene layer may be regrown (or grown for the first time) on the underlying metal layer of the graphene-metal structure in the location of the defect using the processes described herein. For instance, the process to grow the graphene may include adding a carbon-based compound and/or adding a self-assembled monolayer (SAM) so that the graphene may grow upon a heating of the copper substrate and carbon materials coating (e.g., under vacuum or controlled gas atmosphere). In some embodiments, a self-assembled monolayer may be deposited on the metal by immersion of the PCB with exposed metal to molecular material in vapor or liquid form, washing the PCB or laminations stack; baking the PCB or lamination stack to create strong contacts between carbon-based compound/the self-assembled layer and the metal layer, and/or applying localized heat, such as by using a laser, thus forming graphene.

With reference to FIG. 1, a heat source (e.g., a laser) 101 may be used to apply localized heat 103 to the surface of a PCB and/or a lamination stack 105 under vacuum or controlled gas atmosphere. Specifically, the localized heat 103 may only impart heat to a specific portion of the surface of the PCB and/or lamination stack 105, such that only that portion is heated (e.g., a portion where a metal layer of the graphene-metal structure of the PCB and/or lamination stack is exposed and not covered in a graphene-layer post-lamination). In order to grow a graphene layer in that specific location (depicted in FIG. 1 at area 103 for explanatory purposes), a compound 104 may be added to the surface of the PCB and/or lamination stack to promote the growth of the graphene layer on the surface of the PCB and/or lamination stack in the area of the defect. The compound, described in further detail below, may be comprised of such materials as a compound layer (carbon-based) and/or a self-assembled monolayer comprising a head group such as thiol compounds and a carbon-based tail (e.g., the carbon-based tail may comprise methyl, ethyl, or pentyl), to grow graphene. Additionally, a compound layer (carbon-based) may be in the form of polymers, such as polymethyl methacrylate (PMMA), perylene, or amorphous carbon.

In some embodiments, if the surrounding portions of the graphene layer on the PCB and/or lamination stack comprise multiple layers of graphene, the process described herein may be repeated iteratively until the surface of graphene is uniform in thickness across the surface of the PCB. In some embodiments, the multiple layers of graphene on a lamination or PCB may comprise at least one Benzene layer between each layer of self-assembled monolayer of graphene.

With reference to FIGS. 2A-2B, a core 201 is provided as the non-conductive material of the lamination stack that will form the PCB. The adhesive layer(s) 202, 212 (252, 272 of FIG. 2B) of the lamination stack may be applied directly to a surface of the core 201. The adhesive layer(s) 202, 212 may be applied to the bottom or top surface of the core 201, or both surfaces within the lamination stack. As such, a graphene-metal structure 203, 204, 205 (253, 254, 255 of FIG. 2B) may be attached to a top surface of the core 201 (251 of FIG. 2B) using the adhesive layer 202 (252 of FIG. 2B). A first-bottom graphene-metal structure 213, 214, 215 (273, 274, 275 of FIG. 2B) may be attached to a bottom surface of the core 201 (251 of FIG. 2B) using the adhesive layer 212 (272 of FIG. 2B).

In some embodiments, the graphene-metal structure 203, 204, 205, of FIG. 2A, may comprise only one graphene layer and one metal layer that is attached to a surface of the core (e.g., for a bottom/inner graphene layer 203, 204 or for a top/outer graphene layer 204, 205). The graphene-metal structure, in those noted embodiments, may comprise a graphene layer on the bottom/inner surface of the metal layer (e.g., layers 203 and 204 of FIG. 2A) attached to the top surface of the core 201; a graphene layer on the top surface of the metal layer (e.g., layers 204 and 205 of FIG. 2A) attached to the top/outer surface of the core 201; a graphene layer on the bottom/outer surface of the metal layer (e.g., layers 214 and 215 of FIG. 2A) attached to the bottom surface of the core 201; a graphene layer on the top/inner surface of the metal layer (e.g., layers 213 and 214 of FIG. 2A) attached to the bottom surface of the core; or any combination thereof.

In the depicted embodiment of FIG. 2A, the graphene-metal structure may comprise a metal layer having a graphene layer on both a top surface and a bottom surface of the metal layer (e.g., forming a graphene-metal-graphene structure), which is attached to the core 201. An example of such embodiment may be seen in FIG. 2A comprising a core 201, an adhesive layer 202, and a graphene-metal-graphene structure attached via the adhesive layer to the top surface of the core, where the graphene-metal-graphene structure includes a bottom/inner surface of graphene 203 attached to a metal layer 204 and a top/outer surface of graphene 205 attached to an opposite surface of the metal layer 204.

In some cases, and in reference to FIG. 2B, more than one graphene-metal structure 253, 254, 255; 256, 257, 258 may be attached to a top surface of the core 251 using the adhesive layer 252, one atop the other. Moreover, in some embodiments, multiple graphene-metal structures 273, 274, 275; 276, 277, 278 may be attached to a bottom surface of the core 251 using the adhesive layer 272. In some embodiments, the lamination stack of FIG. 2B may only comprise one graphene-metal structure (e.g., structures 253, 254, 255; 256, 257, 258; 273, 274, 275; or 276, 277, 278), may comprise two graphene metal structures of any combination of the graphene-metal structures herein listed (e.g., the graphene-metal structure 253-255 may be coupled with the graphene-metal structure 256, 257, 258; or the graphene-metal structure 273, 274, 275 may be coupled with the graphene-metal structure 276, 277, 278 within the lamination stack; graphene-metal structure 253, 254, 255 may be coupled with the graphene-metal structure 273, 274, 275, and all other combinations of graphene-metal structures herein listed).

In some embodiments, and with reference to FIG. 2B, the multiple graphene-metal structures may be bonded together (e.g., the graphene-metal structure 253, 254, 255 may be bonded with the graphene-metal structure 256, 257, 258, the graphene-metal structure 273, 274, 275 may be bonded with the graphene-metal structure 276, 277, 278) such that the bonded graphene-metal structures, after bonding, will not split apart (e.g., the graphene-metal structure 253, 254, 255 will not split apart from the graphene-metal structure 256, 257, 258). Such a bonding may be completed before the lamination process described herein, such that the entire graphene-metal structure placed on a surface of the core may comprise the layers 253, 254, 255, 256, 257, 258 as one graphene-metal-graphene structure. In some embodiments, the lamination stack, and thus the PCB, may comprise more layers of graphene-metal structures beyond the ones shown in FIG. 2B (e.g., the lamination stack and PCB may comprise three layers of graphene-metal structures, four layers of graphene-metal structures, etc.).

In some embodiments, the bonding process may use a hot-press to sinter the graphene layers together. The hot-press of the graphene-metal structures may further include providing heat comprising a range of 100 degrees Celsius to 900 degrees Celsius including all temperatures comprised within the temperature range described herein, a linear press comprising a range of 1.4 MPa to 50 MPa (i.e., 14 bar to 550 bar) including all pressures comprised within the pressure range described herein, and providing an Argon atmosphere to surround the graphene-metal structures throughout the heating and pressuring process for a predetermined period of time (e.g., 20 minutes).

With reference to FIG. 3, a core 301 is provided as the non-conductive material of the lamination stack of the PCB. The adhesive layer(s) 302, 312 of the lamination stack may be applied directly to a surface of the core. The adhesive layer(s) 302, 312 may be applied to the bottom (312) or top surface (302) of the core 301, or both the bottom and top surfaces of the core. A graphene-metal structure 303-305 may be attached to a top surface of the core using the adhesive layer 302. In addition, a second graphene-metal structure may be attached to the bottom surface of the core 301 (e.g., the graphene-metal structure 313, 314, 315 may be attached using adhesive layer 312).

As will be understood by one skilled in the art in view of the present disclosure, in the embodiments described herein the graphene layer may comprise a monolayer of graphene (e.g., a single atom of thickness) or a multi-layer of graphene (e.g., comprising multiple monolayers of graphene stacked, or grown, on top of each other).

The lamination stacks depicted in FIGS. 2-3 (including FIGS. 2A-2B), in some cases, may be formed according to the methods and disclosure provided in the application Titled, "Process for Laminating Graphene-Coated Printed Circuit Boards," the contents of which has been incorporated by reference in its entirety.

Once the structure of the lamination stack is in place, as described above in connection with FIG. 2A (for explanatory purposes), the lamination process may be performed to create a PCB. For example, the pressure pads 207 and 217 (260 and 280 of FIG. 2B) may apply pressure to the lamination stack at a steady rate or at varying rates so as to apply optimal pressure without creating breakage or separation of the layers of the lamination stack. In some embodiments, the lamination process may further include the application of heat under vacuum or controlled gas atmosphere to grow the graphene on the metal layer of the graphene-metal structure 203, 204, 205; 213, 214, 215, attached to the core 201 via an adhesive layer 202, 212, as described in more detail below.

With reference to FIG. 4, a PCB (formed as the result of performing a lamination process on the lamination stack) is shown. The PCB comprises a core 401; the bottom/inner layer of graphene 403 of the graphene-metal structure attached to the top surface of the core 401; a metal layer 404 of the graphene-metal structure; the top/outer layer of graphene 405 of the graphene-metal structure attached to the opposite surface of the metal layer 404; and the top/inner layer of the graphene 413 attached to the bottom surface of the core 401.

After the lamination process described herein has been used to form the PCB depicted in FIG. 4, the graphene-metal structure of the PCB may be etched to create a trace. The etching process of the PCB may comprise plasma etching of the graphene of the graphene-metal structure(s) and etching the metal layer using a metal etchant. (In comparison, for a copper-metal structure, a copper etchant may be used.)

The top/outer layer of graphene 405 may be removed before the etching process shown in FIG. 4 or after the etching process of FIG. 4. For instance, the graphene layer 405 may be removed due to the surface of the graphene layer 405 coming into contact with another surface and resulting in friction (e.g., contacting a fingernail, a glove, skin, another metal surface, etc.). Such contact, if occurring with enough force to remove part of the graphene layer 405, may thus result in a defect of the graphene-metal structure. In some cases, the defect may occur prior to the lamination process, such that the defect is found in the graphene layer prior to lamination of the lamination stack and formation of the PCB. In this case, embodiments of the processes for repairing the defect(s) described herein may be conducted on the lamination stack. In other cases, however, the defect may arise (or be identified) post-lamination on the PCB. In such cases, the defect or defects may be repaired according to embodiments of the present invention by conducting the process for repair described herein on the PCB.

In some embodiments, a bottom layer of metal, of the graphene-metal structure, may be removed (e.g., in reference to FIG. 3, the metal layer 314—which may also comprise a bottom surface of graphene 315—may be removed) such that only the inner/top layer of graphene 313 is left to insulate the core. In some embodiments, and as discussed herein, the layer of graphene—including the inner/top layer of graphene 313—may comprise multiple layers of graphene to better insulate the core. Likewise, the graphene 303, 305 may insulate the core 301 as described herein with respect to the bottom graphene-metal structure 313-315. Likewise, and as one in the art would know, any layer of graphene herein described may comprise multiple layers of graphene (e.g., the graphene layer may comprise a single-atom thickness of graphene, or multiple-atoms thick of graphene).

FIG. 5 is a flowchart providing an example method 500 for repairing a defect by promoting the growth of graphene in the defect location, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 5 may, for example, be performed by an example apparatus (such as the CVD System incorporated by reference herein) to add each material or layer used in the localized lasering process onto the PCB or lamination stack to grow one or more graphene layers.

The method (e.g., method 500) may include the steps of providing a lamination stack further including at least: a core, one or more adhesive layers, and one or more graphene-metal structures.

The method continues by identifying a defect location in the outer layer of the lamination stack at step 502, wherein the outer layer of the lamination stack may comprise a top/outer layer of graphene in some or most portions of the surface of the lamination stack, where the graphene is attached or grown on an underlying metal layer. A portion of the top/outer layer of the lamination stack may include areas where the metal layer of the graphene-metal structure shows through, such that a portion or most of the top/outer layer of graphene has been stripped away or was never grown before the lamination process, thereby forming the defect location. The defect location, where the graphene is missing, may thus be identified visually by an operator, using Raman spectroscopy or electron microscopy.

The method continues by preparing a surface of the outer layer of the lamination stack (e.g., the outer graphene layer/outer layer comprising the defect location), wherein the surface comprises at least the defect location at step 503. The surface may comprise the defect location of the lamination stack and portions not detected as a defect (e.g., portions of the surface that comprise the correct layer of graphene including monolayers of graphene or multilayers of graphene). The preparation of the surface of the outer layer of the lamination stack may comprise preparation for two graphene growth processes, including the process of applying a carbon-based compound layer (i.e., molecular layer) to the surface of the outer layer or the process of a self-assembled monolayer. Both processes are described in further detail below.

Embodiments of the method 500 may further include applying a carbon-based compound layer to the top layer (e.g., surface) of the lamination stack in the location of the defect (including any of the top/outer layer of graphene that has been left on the lamination stack, but is near the defect location) at step 503. Such a molecular layer may act as a carbon-based precursor material to allow graphene growth on the naked surface of the metal layer of the lamination stack. After the molecular layer has attached itself to the metal layer (e.g., the surface of a copper substrate), then a laser may be applied to the lamination stack to grow the graphene (described in further detail below with respect to FIG. 6). In some embodiments, after the laser has been applied to the lamination stack to grow the graphene, the lamination stack may be washed such that any unattached molecular layer material may be washed away from the lamination stack's surface.

In some embodiments, after the molecular layer has attached itself to the metal layer of the lamination stack, and before the laser is applied to the lamination stack, the lamination stack may be baked to create a stronger bond between the molecular layer and the surface of the lamination stack.

Additionally, embodiments of self-assembled monolayer for graphene growth, may further include the application of a head group, such as a disulfides, amine group, acetic group (COOH), trichlorosilane, silane, siloxane, sulfonate, sulfonic, phosphonic, phosphoric, nitrate, or thiol group, in the location of the defect to act as a self-assembly layer for the growth of a graphene layer on the metal layer of the lamination stack's graphene-metal structure. The process to create a self-assembled monolayer may comprise applying a head group to an exposed metal surface of the lamination stack (e.g., a disulfides, amine group, acetic group (COOH), trichlorosilane, silane, siloxane, sulfonate, sulfonic, phosphonic, phosphoric, nitrate, thiol group or other head group) and allowing the graphene layer to grow through laser annealing (e.g., the application of a laser). The head group— will create a self-assembled monolayer on the surface of the metal layer, wherein the graphene layer will grow only on those portions where the head group has attached to the metal layer. After the head group has attached itself to metal layer (e.g., the surface of a copper substrate), the lamination stack may be washed such that any unattached self-assembled monolayer may be washed away from the lamination stack's surface.

After washing the excess molecules and organic residue (e.g., excess molecular layer and self-assembled monolayer) from the surface of the lamination stack, the lamination stack may be baked at certain temperatures to create a strong bond between the molecular layer and the exposed portion of the metal layer, to create a strong bond between the head group and the exposed portion of the metal layer. Through this process, the molecular layer and/or the self-assembled monolayer, will not evaporate during the heating process used to grow the localized portion of the graphene layer. Instead, by baking the molecular layer and/or self-assembled monolayer on the metal layer, a strong bond is created between the molecular layer/self-assembled monolayer and the metal such that the materials will not evaporate on the exposed portions of the metal layer.

The method may continue with the application of heat under vacuum or controlled gas atmosphere to the defect location at method 600 (FIG. 6). The step of applying heat (e.g., by a laser) to the lamination stack at the defect location may include applying a laser to the lamination stack such that only a small portion of the top layer of the lamination stack is heated, at step 601. The small portion heated by the laser may include less than or up to 100% of the total surface area of the top layer of the lamination stack (i.e., any portion of the top layer of the PCB between the surface area portion of 0% to 100%), such that the whole top layer of the lamination stack is not heated or such that the whole top portion is heated. In some embodiments, the application of heat under vacuum or controlled gas atmosphere to the top layer of the lamination stack may comprise other heating methods such as by placing the lamination stack in a general heating chamber, and any other such available methods.

In some embodiments, a laser may be used to apply the localized heat under vacuum or controlled gas atmosphere to the surface of the lamination stack. By using a laser, the surface area of heat applied to the surface of the lamination stack may be better controlled such that only small portions of the lamination stack's surface are heated. Additionally, the heat from a laser may be pulsed such that the heat applied does not overheat any other un-intended portions of the lamination stack (e.g., materials of the lamination stack).

In some embodiments, the laser may be a type of fiber laser, solid-state laser, or such lasers comprising wavelengths of approximately 1,550 nm; 1,064 nm; 532 nm; 266 nm; 355 nm. In some embodiments, the laser may be a carbon-fit laser comprising wavelengths range of 9.5 to 11.5 micrometers. In some embodiments, based on the carbon-based compound layer used, different types of lasers—further including different types of wavelengths—may be used in the invention described herein.

FIG. 6 is a flowchart providing an example method 600 for localized repair of the surface of the lamination stack, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 6 may, for example, be performed by an example apparatus (such as the CVD System incorporated by reference herein) to iteratively add each material (e.g., the one or more molecular layer(s) and/or self-assembled monolayer(s) after each growth process) used in the localized repair process onto the PCB or lamination stack to grow one or more graphene layers.

The method (e.g., method 600) may include the steps of applying a laser to a lamination stack, wherein the lamination stack comprises a graphene-metal structure, at step 601, and a molecular layer and/or self-assembled monolayer disposed on the exposed metal layer of the lamination stack. By applying the laser to the molecular layer and/or self-assembled monolayer disposed on the exposed metal layer of the lamination stack, the graphene may be grown (e.g., for the first time on the lamination stack or re-grown) in those portions wherein the molecular layer and/or self-assembled monolayer cover the surface of the metal layer.

After washing the excess molecules and organic residue (e.g., excess molecular layer and self-assembled monolayer) from the surface of the lamination stack, the lamination stack may be baked at certain high temperatures to create a strong bond between the self-assembled monolayer and the exposed portion of the metal layer. Such temperatures may comprise any temperature in the range of 25 degrees Celsius to 200 degrees Celsius.

The method (e.g., method 600) may include applying a heat under vacuum or controlled gas atmosphere, (such as the vacuum or controlled gas atmospheres described in the CVD System applications incorporated by reference), particularly a localized heat, to a portion of the top surface of the lamination stack. For example, a laser may be used to apply localized heat to an exposed portion of the metal layer (including a molecular layer and/or self-assembled monolayer) of the graphene-metal structure of the lamination stack, at step 601.

The method may further comprise pulsing the laser described herein (e.g., pulsing the scan rate of the laser and the laser power) to ensure that the temperature at the defect location or elsewhere on the substrate does not exceed a certain temperature and scan rate such that the local temperature of the lamination stack will not reach the melting point. In some embodiments, the laser may be continuously run with longer dwell times between each laser on-period. The laser's on-period (and dwell period) may be controlled based on the type of materials used within the lamination stack and their individual melting points.

The method may further include growing a portion of graphene on the top surface of the lamination stack through the use of certain compounds (e.g., a molecular layer and/or self-assembled monolayer) and a baking process to bond the one or more compounds to the surface of the exposed metal layer, at step 602.

FIG. 7 is a flowchart providing an example method 700 for repairing a defect by promoting the growth of graphene in the defect location, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 7 may, for example, be performed by an example apparatus (such as the CVD System incorporated by reference herein) to add each material or layer used in the localized lasering process onto the PCB or lamination stack to grow one or more graphene layers.

The method (e.g., method 700) may include the steps of providing a PCB further including at least: a core, one or more adhesive layers, and one or more graphene-metal structures.

The method continues by identifying a defect location in the outer layer of the PCB (wherein the PCB is comprised of the layers of the lamination stack after the layers have gone through lamination) at step 702, wherein the outer layer of the PCB may comprise a top/outer layer of graphene in some or most portions of the surface of the PCB, where the graphene is attached or grown on an underlying metal layer. A portion of the top/outer layer of the PCB may include areas where the metal layer of the graphene-metal structure shows through, such that a portion or most of the top/outer layer of graphene has been stripped away or was never grown before the lamination process, thereby forming the defect location. The defect location, where the graphene is missing, may thus be identified visually by an operator, using Raman spectroscopy or electron microscopy.

The method continues by preparing a surface of the outer layer of the PCB (e.g., the outer graphene layer/outer layer comprising the defect location), wherein the surface comprises at least the defect location at step 703. The surface may comprise the defect location of the PCB and portions not detected as a defect (e.g., portions of the surface that comprise the correct layer of graphene including monolayers of graphene or multilayers of graphene). The preparation of the surface of the outer layer of the PCB may comprise preparation for two graphene growth processes, including the process of applying a carbon-based compound layer (i.e., a molecular layer) to the surface of the outer layer or the process of a self-assembled monolayer. Both processes are described in further detail below.

Embodiments of the method 700 may further include applying a carbon-based compound layer to the top layer of the PCB in the location of the defect (including any of the top/outer layer of graphene that has been left on the PCB, but is near the defect location) at step 703. Such a molecular layer may act as a carbon-based precursor material to allow graphene growth on the naked surface of the metal layer of the PCB. After the carbon-based compound layer has attached itself to the metal layer (e.g., the surface of a copper substrate), then a laser may be applied to the PCB to grow the graphene (described in further detail below with respect to FIG. 7). In some embodiments, after the laser has been applied to the PCB to grow the graphene, the PCB may be washed such that any unattached molecular layer material may be washed away from the PCB's surface.

In some embodiments, after the molecular layer has attached itself to the metal layer of the PCB, and before the laser is applied to the PCB, the PCB may be baked to create a stronger bond between the molecular layer and the surface of the PCB.

Additionally, embodiments of the method 700 may include a self-assembled monolayer of graphene, further including the application of disulfides, amine group, acetic group (COOH), trichlorosilane, silane, siloxane, sulfonate, sulfonic, phosphonic, phosphoric, nitrate, thiol group or other head group, in the location of the defect to act as a self-assembly layer for a graphene layer on the metal layer of the PCB's graphene-metal structure. The process to create a self-assembly monolayer of graphene on the surface of the metal layer may comprise applying a head group to an exposed metal surface of the PCB (e.g., a disulfides, amine group, acetic group (COOH), trichlorosilane, silane, siloxane, sulfonate, sulfonic, phosphonic, phosphoric, nitrate, thiol group or other head group) and allowing the graphene layer to grow through laser annealing (e.g., the application of a laser). The head group will create a self-assembled monolayer on the surface of the metal layer, wherein the graphene layer will grow only on those portions where the head group has attached to the metal layer. After the head group has attached itself to the metal layer (e.g., the surface of the copper substrate), the PCB may be washed such that any unattached self-assembled monolayer may be washed away from the PCB's surface.

After washing the excess molecules and organic residue (e.g., excess molecular layer and self-assembled monolayer) from the surface of the PCB, the PCB may be baked at certain high temperatures to create a strong bond between the molecular layer and the exposed portion of the metal layer or to create a strong bond between the head group and the exposed portion of the metal layer. Such high temperatures may comprise any temperature in the range of 25 degrees Celsius to 200 degrees Celsius. Through this process, the molecular layer, the self-assembled monolayer, will not evaporate during the heating process used to grow the localized portion of the graphene layer. Instead, by baking the molecular layer and/or self-assembled monolayer on the metal layer, a strong bond is created between the molecular layer and/or head group and the metal layer to prevent evaporation of the molecular layer and/or functional group such that the materials will not evaporate on the exposed portions of the metal layer.

The method may continue with the application of heat under vacuum or controlled gas atmosphere to the defect location at step 800 (FIG. 8). The step of applying heat to the PCB under vacuum or controlled gas atmosphere at the defect location may include applying a laser to the PCB such that only a small portion of the top layer of the PCB stack is heated, at step 801. The small portion heated by the laser may include less than or up to 100% of the total surface area of the top layer of the PCB (i.e., any portion of the top layer of the PCB between the surface area portion of 0% to 100%), such that the whole top layer of the PCB is not heated or such that the whole top portion is heated. In some embodiments, the application of heat to the top layer of the PCB may comprise other heating methods such as by placing the PCB in a general heating chamber, and any other such available methods.

In some embodiments, a laser may be used to apply the localized heat under vacuum or controlled gas atmosphere to the surface of the PCB. By using a laser, the surface area of heat applied to the surface of the PCB may be better controlled such that only small portions of the PCB surface are heated. Additionally, the heat from a laser may be pulsed such that the heat applied does not overheat any other unintended portions of the PCB (e.g., materials of the lamination stack).

In some embodiments, the laser may be a type of fiber laser, solid-state laser, or such lasers comprising wavelengths of approximately 1,550 nm; 1,064 nm; 532 nm; 266 nm; 355 nm. In some embodiments, the laser may be a carbon-fit laser comprising wavelengths range of 9.5 to 11.5 micrometers. In some embodiments, based on the carbon-based compound layer used, different types of lasers—further including different types of wavelengths—may be used in the invention described herein.

FIG. 8 is a flowchart providing an example method 800 for localized repair of the surface of the PCB, in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 6 may, for example, be performed by an example apparatus (such as the CVD System incorporated by reference herein) to iteratively add each material (e.g., the one or more molecular layer(s) and/or self-assembled monolayer(s) after each growth process) used in the localized repair process onto the PCB or lamination stack to grow one or more graphene layers.

The method (e.g., method 800) may include the steps of applying a laser to a PCB, wherein the PCB comprises a graphene-metal structure, at step 801, and a molecular layer and/or functional group/self-assembled monolayer disposed on the exposed metal layer of the PCB.

After washing excess molecules and organic residue, the PCB may be baked at certain high temperatures to create a strong bond between the self-assembled monolayer and the exposed portion of the metal layer. Such high temperatures may comprise any temperature in the range of 25 degrees Celsius to 200 degrees Celsius.

The method (e.g., method 800) may include applying a heat under vacuum or controlled gas atmosphere (such as the vacuum or controlled gas atmosphere described in the CVD System applications incorporated by reference), particularly a localized heat, to a portion of the top surface of the PCB. For example, a laser may be used to apply localized heat to an exposed portion of the metal layer (including a molecular layer or a self-assembled monolayer) of the graphene-metal structure of the PCB, at step 801.

The method may further comprise pulsing the laser described herein (e.g., pulsing the scan rate of the laser and the laser power) to ensure that the temperature at the defect location or elsewhere on the substrate does not exceed a certain temperature and scan rate such that the local temperature of the polymer part(s) (e.g., polyethylene, polypropylene, polyurethane) of the PCB will not reach the melting point for each type of polymer. In some embodiments, the laser may be continuously run with longer dwell times between each laser on-period. The laser's on-period (and dwell period) may be controlled based on the type of materials used within the PCB and their individual melting points.

The method may further include growing a portion of graphene on the top surface of the PCB through the use of certain compounds (e.g., a molecular layer and/or a self-assembled monolayer) and a baking process to bond the one or more compounds to the surface of the exposed metal layer, at step 802.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A method of repairing one or more layers of a lamination stack or Printed Circuit Board (PCB) comprising:
   providing a layered structure, wherein an outer layer comprises a graphene-metal structure, and wherein the graphene-metal structure comprises a metal layer and an outer graphene layer disposed on the metal layer;
   identifying a defect location in the outer graphene layer, wherein the defect location comprises an absence of graphene due to failed graphene growth or removal of the graphene post-growth on the metal layer, wherein the absence of graphene at the defect location exposes a portion of the metal layer;
   preparing a surface of the outer graphene layer for repair, wherein the surface of the outer graphene layer comprises at least the defect location; and
   applying localized heat to the defect location,
   wherein application of the localized heat encourages growth of graphene in the defect location.

2. The method of claim 1, wherein preparing the surface of the outer graphene layer comprises cleaning a surface of the metal layer in the defect location prior to the application of localized heat.

3. The method of claim 1, wherein preparing the surface of the outer graphene layer comprises applying a molecular layer to the metal layer in the defect location.

4. The method of claim 3, further comprising baking the layers.

5. The method of claim 4, further comprising washing the lamination stack to clean an excess of the molecular layer.

6. The method of claim 1, wherein preparing the surface of the outer graphene layer comprises applying a self-assembled monolayer to the metal layer in at least the defect location.

7. The method of claim 6, further comprising washing the layers to clean the self-assembled monolayer.

8. The method of claim 7, further comprising baking the layers.

9. The method of claim 1, wherein the layered structure forms at least a portion of a Printed Circuit Board (PCB) and wherein the metal layer comprises a trace of the PCB.

10. The method of claim 1, wherein the layered structure forms at least a portion of a lamination stack.

11. The method of claim 1, wherein applying the localized heat comprises applying the localized heat via a laser.

12. The method of claim 11, further comprising determining a local temperature for configuring the laser, wherein the local temperature is determined by a laser power density and a laser scan rate.

13. The method of claim 1, wherein applying the localized heat comprises pulsing the localized heat.

14. The method of claim 1, wherein applying the localized heat comprises continuously applying the localized heat.

15. The method of claim 1, further comprising cooling the lamination stack at the defect location by pulsing the localized heat.

16. The method of claim 1, wherein the absence of graphene at the defect location is caused by a scratch or mechanical damage.

17. The method of claim 1, wherein the localized heat is incident on an outer two-dimensional material precursor of the defect location.

* * * * *